United States Patent
Zhang (10) Patent No.: US 11,145,832 B2
(45) Date of Patent: Oct. 12, 2021

(54) FLEXIBLE BASE SUBSTRATE, FLEXIBLE DISPLAY PANEL, AND METHOD FOR PREPARING THE SAME

(71) Applicant: WUHAN CHINA STAR OPTOELECTRONICS SEMICONDUCTOR DISPLAY TECHNOLOGY CO., LTD., Hubei (CN)

(72) Inventor: Fuyang Zhang, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 62 days.

(21) Appl. No.: 16/639,747

(22) PCT Filed: Nov. 5, 2019

(86) PCT No.: PCT/CN2019/115711
§ 371 (c)(1),
(2) Date: Feb. 18, 2020

(87) PCT Pub. No.: WO2021/035950
PCT Pub. Date: Mar. 4, 2021

(65) Prior Publication Data
US 2021/0066623 A1 Mar. 4, 2021

(51) Int. Cl.
*H01L 51/00* (2006.01)
*H01L 51/52* (2006.01)
*H01L 51/56* (2006.01)

(52) U.S. Cl.
CPC ...... *H01L 51/0097* (2013.01); *H01L 51/5253* (2013.01); *H01L 51/56* (2013.01)

(58) Field of Classification Search
CPC . H01L 51/5253; H01L 51/56; H01L 27/3244; H01L 51/003; H01L 2251/566; Y02E 10/549
See application file for complete search history.

(56) References Cited

U.S. PATENT DOCUMENTS

| | | | |
|---|---|---|---|
| 2015/0004306 A1 | 1/2015 | Cho | |
| 2019/0131551 A1* | 5/2019 | Xie | C08G 73/1067 |
| 2020/0006685 A1 | 1/2020 | Xie | |

FOREIGN PATENT DOCUMENTS

| | | |
|---|---|---|
| CN | 106992263 A | 7/2017 |
| CN | 107680994 A | 2/2018 |
| CN | 109065581 A | 12/2018 |
| CN | 109755410 A | 5/2019 |
| CN | 109950426 A | 6/2019 |

* cited by examiner

Primary Examiner — Kyoung Lee
(74) Attorney, Agent, or Firm — Mark M. Friedman (57) ABSTRACT

A flexible base substrate, a flexible display panel, and a method for preparing the same are provided. By preparing a composite substrate structure composed of a first polyimide layer, a water-oxygen barrier layer, a protective layer, and a second polyimide layer, the prepared flexible display panel has desired water and oxygen barrier property, thereby greatly reducing the probability of water and oxygen passing through the flexible base substrate, and improving the service lifespan of the flexible display panel.

20 Claims, 4 Drawing Sheets

FLEXIBLE BASE SUBSTRATE, FLEXIBLE DISPLAY PANEL, AND METHOD FOR PREPARING THE SAME

FIELD OF DISCLOSURE

The present application relates to the field of display technology, and particularly relates to a flexible base substrate, a flexible display panel, and a method for preparing the same.

BACKGROUND OF DISCLOSURE

With the development of display technology, the requirements for color and portability are getting higher. The flexibility of display panels has become the general trend of the development of modern display devices. Flexible displays are gradually entering the consumer electronics market, such as mobile devices and televisions. Unlike traditional display technology using rigid substrates, the flexible displays use flexible substrates, such as flexible resins, flexible metal, and ultra-thin glass. Among them, the flexible resins are widely used in the substrates of the flexible displays because of their desired shaping and high surface flatness. However, compared with metal and glass, resin materials are susceptible to intrusions of oxygen ($O_2$), water ($H_2O$), and so on, which affect the reliability of the panel.

Figure 1A:
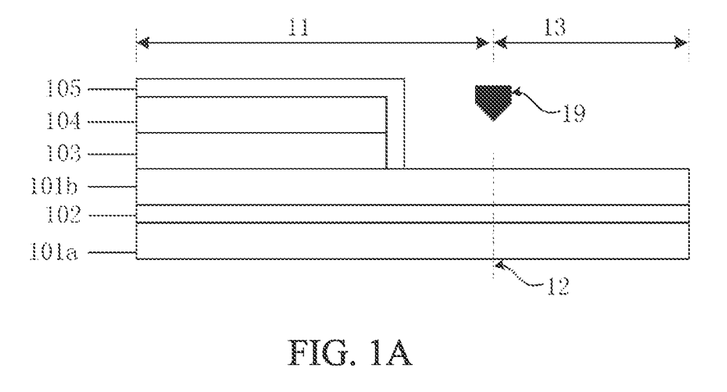
FIG. 1A is a schematic structural diagram of an existing flexible display panel before being cut.
Figure 1B:
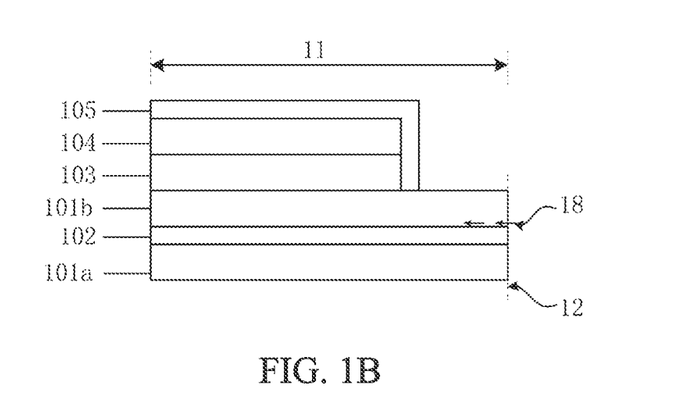
FIG. 1B is a schematic structural diagram of the existing flexible display panel after being cut.

Referring to FIG. 1A to FIG. 1B, FIG. 1A is a schematic structural diagram of an existing flexible display panel before being cut, and FIG. 1B is a schematic structural diagram of the existing flexible display panel after being cut.

As shown in FIG. 1A, the existing flexible display panel before being cut comprises a panel area 11 and a panel edge area 13 divided by a laser cut line 12 (a cutting blade 19 cuts longitudinally along the laser cut line 12). The panel area 11 comprises a first polyimide layer 101a, a water-oxygen barrier layer 102, and a second polyimide layer 101b sequentially stacked and disposed, and a thin film transistor (TFT) array layer 103 and an organic light emitting layer 104 sequentially disposed on the second polyimide layer 101b. An encapsulation layer 105 is disposed on the organic light emitting layer 104, covers a lateral side of the thin film transistor array layer 103 and a lateral side of the organic light emitting layer 104 near the laser cut line 12, and partially covers the second polyimide layer 101b. The panel edge area 13 comprises a first polyimide layer 101a, a water-oxygen barrier layer 102, and a second polyimide layer 101b sequentially stacked and disposed. The water-oxygen barrier layer 102 is configured to block water/oxygen permeation from a bottom of the second polyimide layer 101b.

In the process of panel preparation, a laser or other means is used to cut along the laser cut line 12, the panel edge area 13 is cut off, and the final panel only retains the panel area 11, as shown in FIG. 1B.

For the existing flexible display panel after being cut, although the water-oxygen barrier layer 102 can block water/oxygen permeation from the bottom of the second polyimide layer 101b, the water/oxygen will permeate along a lateral side of the second polyimide layer 101b near the original laser cut line 12 (as shown by an arrow 18 in FIG. 1B), thereby permeating into the circuit of the thin film transistor array layer 103, and affecting the service lifespan of the light emitting material of the organic light emitting layer 104.

Therefore, how to prevent the damage to the reliability of the panel caused by water, oxygen, and other intrusions, and how to improve the reliability of the flexible display panel are the technical problems to be solved in the development of the flexible display panel at present.

SUMMARY OF DISCLOSURE

The purpose of the present application provides a flexible base substrate, a flexible display panel, and a method for preparing the same, aiming at the problems existing in the prior art, prevents the damage to the reliability of the panel caused by water, oxygen, and other intrusions, and improves the reliability of the flexible display panel.

To achieve the above purpose, the present application provides a flexible base substrate having a panel area a panel edge area divided by a laser cut line. The flexible base substrate comprises: a first polyimide layer formed in the panel area and the panel edge area; a water-oxygen barrier layer covering the first polyimide layer; a protective layer disposed on the water-oxygen barrier layer in the panel area and near the laser cut line; wherein a material of the protective layer comprises at least one of silicon oxide, silicon nitride, and amorphous silicon, and a thickness of the protective layer ranges from 0.1 to 5 μm; and a second polyimide layer covering the protective layer and the water-oxygen barrier layer.

To achieve the above purpose, the present application further provides a flexible display panel comprising a panel area, and the panel area comprises a display area and a non-display area. The flexible display panel comprises: a flexible base substrate comprising a first polyimide layer formed in the display area and the non-display area, a water-oxygen barrier layer covering the first polyimide layer, a protective layer disposed on the water-oxygen barrier layer and corresponding to the non-display area, and a second polyimide layer covering the protective layer and the water-oxygen barrier layer; and a thin film transistor array layer and an encapsulation layer sequentially stacked and disposed on the flexible base substrate and corresponding to the display area, wherein the encapsulation layer covers a lateral side of the thin film transistor array layer near the non-display area, and partially covers the second polyimide layer.

To achieve the above purpose, the present application further provides a method for preparing a flexible display panel comprising the following steps: providing a rigid substrate, wherein the rigid substrate has a panel area and a panel edge area divided by a laser cut line, wherein the panel area comprises a display area and a non-display area, and the non-display area is near the laser cut line; preparing a first polyimide layer on the rigid substrate, wherein the first polyimide layer is formed in the panel area and the panel edge area; depositing a water-oxygen barrier layer on the first polyimide layer, wherein the water-oxygen barrier layer covers the first polyimide layer; preparing a protective layer on the water-oxygen barrier layer corresponding to the non-display area, wherein the protective layer is near the laser cut line; preparing a second polyimide layer on the protective layer and the water-oxygen barrier layer; sequentially preparing a thin film transistor array layer and an encapsulation layer on the second polyimide layer corresponding to the display area, wherein the encapsulation layer covers a lateral side of the thin film transistor array layer near the non-display area, and partially covers the second polyimide layer; separating the rigid substrate from the first polyimide layer, and cutting the panel edge area along the laser cut line to obtain the flexible display panel.

The advantage of the present application is that by preparing a composite substrate structure composed of the first polyimide layer, the water-oxygen barrier layer, the protective layer, and the second polyimide layer, the prepared flexible display panel has desired water and oxygen barrier property, thereby greatly reducing the probability of water and oxygen passing through the flexible base substrate, and improving the service lifespan of the flexible display panel. Also, the flexible base substrate has desired flexibility, which is conducive to a wide range of applications.

DESCRIPTION OF DRAWINGS

In order to clearly illustrate the embodiments of the present disclosure, the following briefly introduces the accompanying drawings used in the embodiments. Obviously, the drawings in the following description merely show some of the embodiments of the present disclosure. As regards one of ordinary skill in the art, other drawings may be obtained in accordance with these accompanying drawings without making creative efforts.

DETAILED DESCRIPTION OF PREFERRED EMBODIMENTS

The embodiments of the present application are described in detail below, and examples of the embodiments are shown in the drawings, wherein the same or similar reference numerals indicate the same or similar elements or elements having the same or similar functions throughout. The embodiments described below with reference to the drawings are exemplary and are only used to explain the present application, and should not be construed as limiting the present application.

The terms "first", "second", "third", and the like (if present) in the description and claims of the present application and the drawings are used to distinguish similar objects, and are not necessarily used to describe a specific order or sequence. It should be understood that the objects described in this way are interchangeable under appropriate circumstances. In addition, the terms "including" and "having" and any variations thereof are intended to cover the inclusion without exclusion.

In the present application, unless explicitly stated and defined otherwise, the first feature "above" or "below" the second feature may include that the first feature is directly contact with the second feature, and may also include that the first feature is indirectly contact with the second feature through other features between them. Moreover, the first feature "above", "on" and "over" the second feature includes that the first feature is directly above and obliquely above the second feature, or merely indicates that the first feature is higher in level than the second feature. The first feature "below", "under" and "beneath" the second feature includes that the first feature is directly below and obliquely below the second feature, or merely indicates that the first feature is lower in level than the second feature.

The following disclosure provides many different embodiments or examples for implementing different structures of the present application. To simplify the disclosure of the present application, the components and settings of specific examples are described below. Of course, they are merely examples and are not intended to limit the present application. The present application may repeat reference numerals and/or reference letters in different examples. Such repetition is for simplicity and clarity, and does not indicate a relationship between the various embodiments and/or settings discussed. In addition, the present application provides examples of various specific processes and materials, but those skilled in the art may be aware of the applications of other processes and/or the use of other materials.

Figure 2:
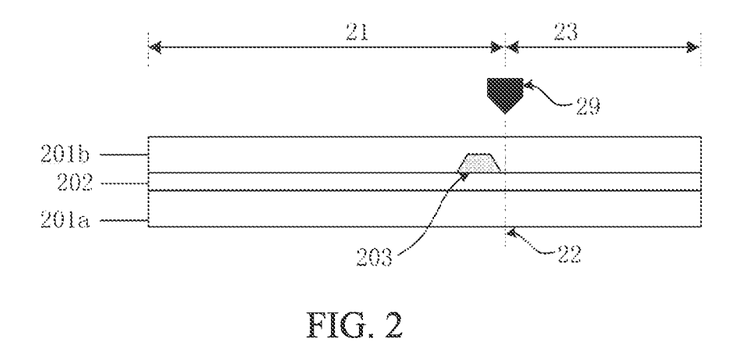
FIG. 2 is a schematic structural diagram of a flexible base substrate according to an embodiment of the present application.

Referring to FIG. 2, FIG. 2 is a schematic structural diagram of a flexible base substrate according to an embodiment of the present application. In the present embodiment, the flexible base substrate comprises a panel area 21 and a panel edge area 23 divided by a laser cut line 22 (a cutting blade 29 cuts longitudinally along the laser cut line 22). The panel area 21 comprises a first polyimide layer 201a, a water-oxygen barrier layer 202, a protective layer 203, and a second polyimide layer 201b sequentially stacked and disposed. The panel edge area 23 comprises a first polyimide layer 201a, a water-oxygen barrier layer 202, and a second polyimide layer 201b sequentially stacked and disposed.

Particularly, the first polyimide layer 201a is formed in the panel area 21 and the panel edge area 23. A material of the first polyimide layer 201a is a polyimide resin or a modified polyimide resin, and a thickness of the first polyimide layer 201a ranges from 5 to 15 μm, preferably 10 μm.

Particularly, the water-oxygen barrier layer 202 covers the first polyimide layer 201a, and, that is, the water-oxygen barrier layer 202 corresponds to the panel area 21 and the panel edge area 23. A material of the water-oxygen barrier layer 202 is silicon oxide ($SiO_x$) or silicon nitride ($SiN_x$), and a thickness of the water-oxygen barrier layer 202 ranges from 0.2 to 1 μm, preferably 0.5 μm. The water-oxygen barrier layer 202 is configured to block water and oxygen from permeating into the second polyimide layer 201b, so as to prevent the damage to components prepared on the flexible base substrate (e.g., the circuit of the thin film transistor array layer and the light emitting material of the light emitting layer) caused by water, oxygen, and other intrusions, and improve the reliability of the flexible display panel adopting the flexible base substrate of the present application.

Particularly, the protective layer 203 is disposed on the water-oxygen barrier layer 202 in the panel area 21 and near the laser cut line 22, and, that is, the protective layer 203 corresponds to the panel area 21 and near the laser cut line 22. A material of the protective layer 203 comprises at least one of silicon oxide ($SiO_x$), silicon nitride ($SiN_x$), and amorphous silicon (α-Si), and a thickness of the protective layer 203 ranges from 0.1 to 5 μm, preferably 0.5 μm, 1 μm, or 2 μm. In the subsequent preparation of the flexible display panel, a laser or other means is used to cut along the laser cut line 22, the panel edge area 23 is cut off, and the final panel only retains the panel area 21. The retained panel area 21 after being cut is provided with the protective layer 203 near the laser cut line 22, which can extend the permeation path of water and oxygen to the second polyimide layer 201b from a side near the laser cut line 22. Thus, the flexible base substrate has excellent ability to block water and oxygen, and the reliability of the flexible display panel adopting the flexible base substrate of the present application is further improved.

The second polyimide layer 201b covers the protective layer 203 and the water-oxygen barrier layer 202, and, that is, the second polyimide layer 201b corresponds to the panel area 21 and the panel edge area 23. A material of the second polyimide layer 202a is a polyimide resin or a modified polyimide resin, and a thickness of the second polyimide layer 202a ranges from 5 to 15 μm, preferably 10 μm. The thicknesses of the first polyimide layer 201a and the second polyimide layer 201b may be different, and the specific thicknesses can be selected according to the actual device type.

The flexible base substrate of the present embodiment adopts a composite substrate structure composed of the first polyimide layer 201a, the water-oxygen barrier layer 202, the protective layer 203, and the second polyimide layer 201b. Compared with a single polyimide flexible substrate or a flexible substrate prepared by other organic polymeric materials, the flexible base substrate of the present embodiment has the characteristics as follow. The flexible base substrate has desired water and oxygen barrier property to greatly reduce the probability of water and oxygen passing through the flexible base substrate, which can protect the thin film transistor array layer and the light emitting layer prepared thereon, thereby improving the service lifespan of the flexible display panel. Also, the flexible base substrate has desired flexibility, which can be widely used in preparing the flexible display panel.

Figure 3:
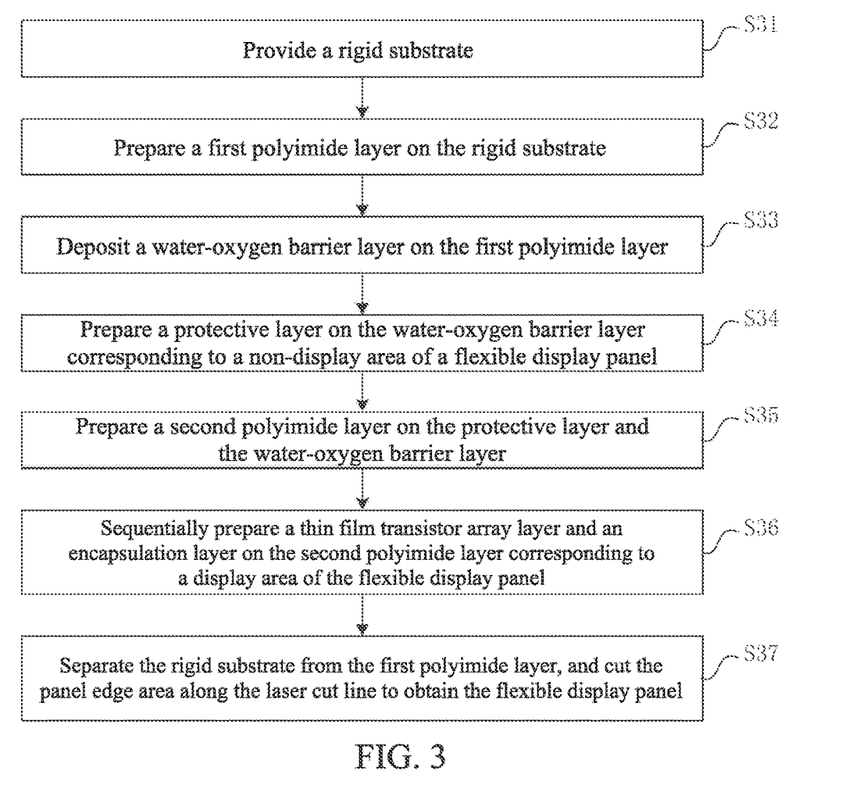
FIG. 3 is a schematic flowchart of a method for preparing a flexible display panel according to the present application.

Referring to FIG. 3, FIG. 3 is a schematic flowchart of a method for preparing a flexible display panel according to the present application. The preparation method of the present application comprises the steps as follows. S31: a rigid substrate is provided; S32: a first polyimide layer is prepared on the rigid substrate; S33: a water-oxygen barrier layer is deposited on the first polyimide layer; S34: a protective layer is prepared on the water-oxygen barrier layer corresponding to the non-display area of the flexible display panel; S35: a second polyimide layer is prepared on the protective layer and the water-oxygen barrier layer; S36: a thin film transistor array layer and an encapsulation layer are sequentially prepared on the second polyimide layer corresponding to the display area of the flexible display panel; S37: the rigid substrate is separated from the first polyimide layer, and the panel edge area is cut along the laser cut line to obtain the flexible display panel. The detailed description is given below in combination with the drawings.

S31: a rigid substrate is provided.

In a further embodiment, the rigid substrate has a panel area and a panel edge area divided by a laser cut line, wherein the panel area comprises a display area and a non-display area, and the non-display area is near the laser cut line.

In a further embodiment, the rigid substrate may be a glass substrate, a silicon wafer, a metal or a rigid thin film. The rigid substrate needs to have a high laser transmittance to facilitate the subsequent laser stripping process.

S32: a first polyimide layer is prepared on the rigid substrate.

In a further embodiment, the first polyimide layer covers the panel area and the panel edge area.

In a further embodiment, a material of the first polyimide layer is a polyimide resin or a modified polyimide resin, and a thickness of the first polyimide layer ranges from 5 to 15 μm, preferably 10 μm.

S33: a water-oxygen barrier layer is deposited on the first polyimide layer.

In a further embodiment, the water-oxygen barrier layer covers the first polyimide layer, and, that is, the water-oxygen barrier layer corresponds to the panel area and the panel edge area.

In a further embodiment, a material of the water-oxygen barrier layer is silicon oxide ($SiO_x$) or silicon nitride ($SiN_x$), and a thickness of the water-oxygen barrier layer ranges from 0.2 to 1 μm, preferably 0.5 μm. The water-oxygen barrier layer is configured to block water and oxygen from permeating into the second polyimide layer subsequently prepared, so as to prevent the damage to panel display components prepared on the flexible base substrate (e.g., the circuit of the thin film transistor array layer and the light emitting material of the light emitting layer) caused by water, oxygen, and other intrusions, and improve the reliability of the flexible display panel adopting the flexible base substrate of the present application.

S34: a protective layer is prepared on the water-oxygen barrier layer corresponding to the non-display area of the flexible display panel.

In a further embodiment, the protective layer corresponds to the panel area and near the laser cut line.

In a further embodiment, a material of the protective layer comprises at least one of silicon oxide ($SiO_x$), silicon nitride ($SiN_x$), and amorphous silicon (α-Si), and a thickness of the protective layer ranges from 0.1 to 5 μm, preferably 0.5 μm, 1 μm, or 2 μm. In the subsequent preparation of the flexible display panel, a laser or other means is used to cut along the laser cut line, the panel edge area is cut off, and the final panel only retains the panel area. The retained panel area after being cut is provided with the protective layer near the laser cut line, which can extend the permeation path of water and oxygen to the second polyimide layer from a side near the laser cut line. Thus, the flexible base substrate has excellent ability to block water and oxygen, and the reliability of the flexible display panel adopting the flexible base substrate of the present application is further improved.

S35: a second polyimide layer is prepared on the protective layer and the water-oxygen barrier layer.

In a further embodiment, the second polyimide layer covers the protective layer and the water-oxygen barrier layer, and, that is, the second polyimide layer corresponds to the panel area and the panel edge area.

In a further embodiment, a material of the second polyimide layer is a polyimide resin or a modified polyimide resin, and a thickness of the second polyimide layer ranges from 5 to 15 μm, preferably 10 μm. The thicknesses of the first polyimide layer and the second polyimide layer may be different, and the specific thicknesses can be selected according to the actual device type.

S36: a thin film transistor array layer and an encapsulation layer are sequentially prepared on the second polyimide layer corresponding to the display area of the flexible display panel.

In a further embodiment, the thin film transistor array layer comprises a gate insulating layer (GI) and a dielectric layer (OLD) stacked and disposed, and functional components arranged inside. The functional components comprise a polysilicon layer, a gate electrode (GE), and a source/drain electrode (S/D). The thin film transistor array layer has a conventional structure, and the material and the thickness of each film layer adopted can be adjusted according to the requirements, and are not specifically limited in the present application.

In a further embodiment, the encapsulation layer covers an upper surface of the thin film transistor array layer, covers a lateral side of the thin film transistor array layer near the non-display area, and partially covers the second polyimide layer. The encapsulation layer has a conventional structure, and the material and the thickness adopted can be adjusted according to the requirements.

In a further embodiment, a light emitting layer is prepared on the thin film transistor array layer. The light emitting layer is an organic light emitting diode (OLED) light emitting layer, and, that is, the prepared flexible display panel of the present application is an OLED flexible display panel. Thus, the encapsulation layer is prepared on the light emitting layer. The encapsulation layer covers a lateral side of the thin film transistor array layer and a lateral side of the light emitting layer near the non-display area, and partially covers the second polyimide layer. The OLED light emitting layer comprises an anode, an OLED light emitting material layer, and a cathode stacked and disposed. The OLED light emitting layer has a conventional structure, and the material and the thickness of each film layer adopted can be adjusted according to the requirements, and are not specifically limited in the present application. In other embodiments, a quantum dot (QD)-OLED flexible display panel and other light emitting flexible display panels can be prepared according to the requirements.

S37: the rigid substrate is separated from the first polyimide layer, and the panel edge area is cut along the laser cut line to obtain the flexible display panel.

In a further embodiment, the rigid substrate is separated from the first polyimide layer using the laser stripping process, and the panel edge area is cut along the laser cut line using the laser to obtain the flexible display panel. The laser stripping process and the laser cutting process may be operated according to the conventional process in the art, and are not specifically limited in the present application.

The present application provides a novel method for preparing a flexible display panel. By preparing a composite substrate structure composed of the first polyimide layer, the water-oxygen barrier layer, the protective layer, and the second polyimide layer, the prepared flexible display panel has desired water and oxygen barrier property, thereby greatly reducing the probability of water and oxygen passing through the flexible base substrate, and improving the service lifespan of the flexible display panel. Also, the flexible base substrate has desired flexibility, which is conducive to a wide range of applications.

Figure 4A:
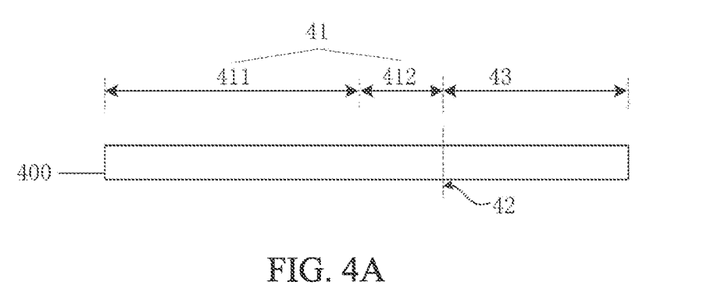
FIG. 4A to FIG. 4F are flowcharts of the preparation of a flexible display panel according to an embodiment of the present application.
Figure 4B:
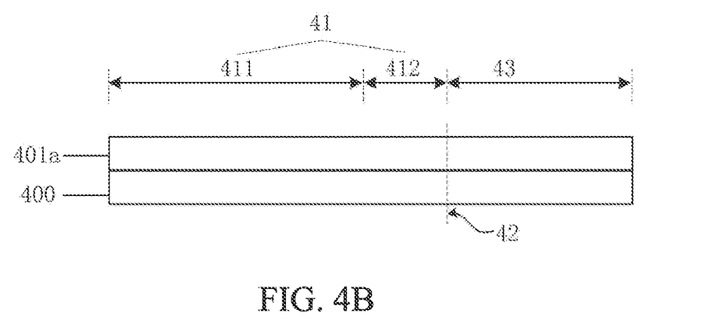
Figure 4C:
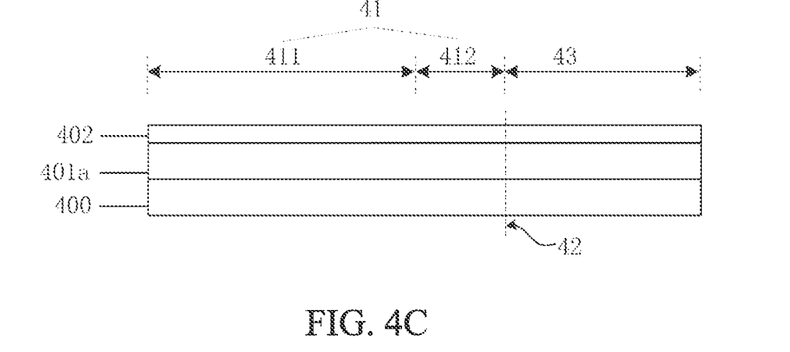
Figure 4D:
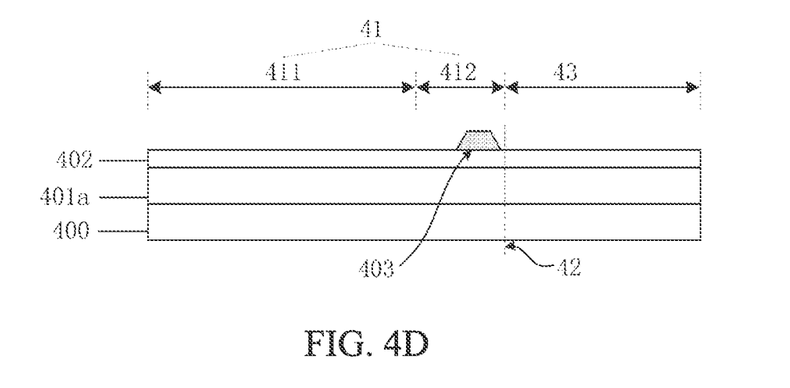
Figure 4E:
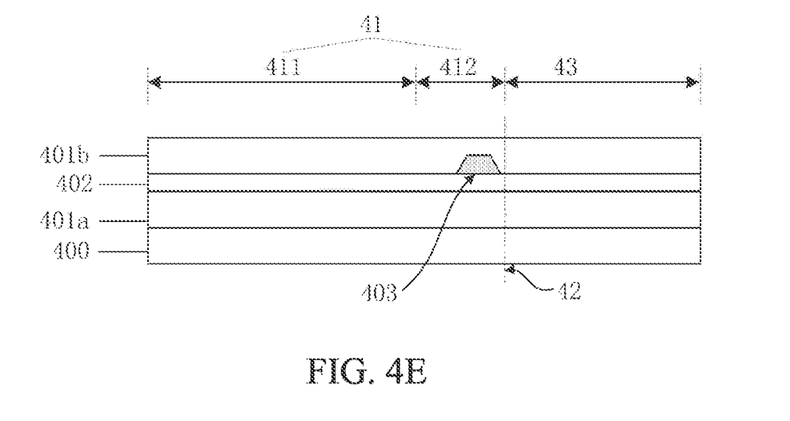
Figure 4F:
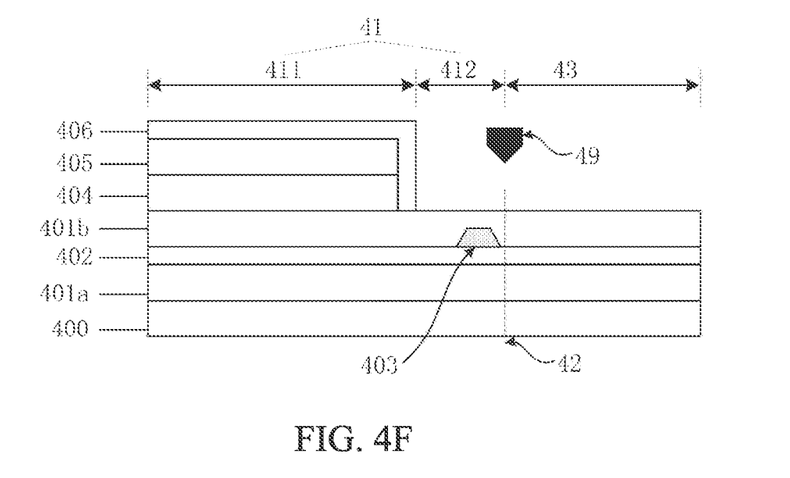
Figure 5:
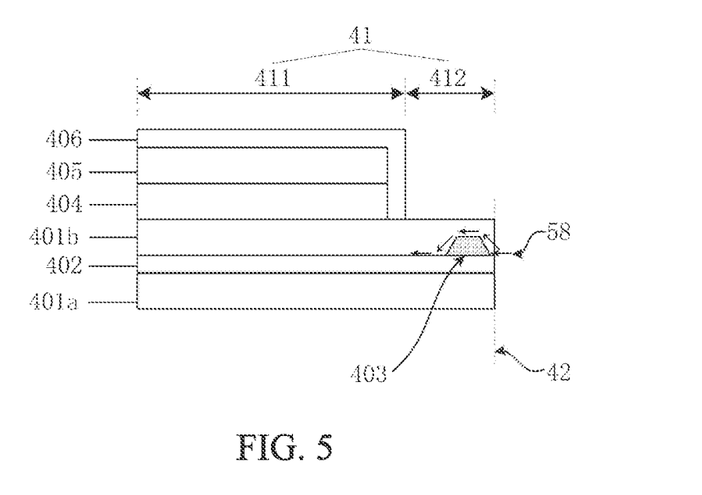
FIG. 5 is a schematic layered structural diagram of a flexible display panel according to an embodiment of the present application.

Referring to FIG. 3, FIG. 4A to FIG. 4F, and FIG. 5 together, FIG. 4A to FIG. 4F are flowcharts of the preparation of a flexible display panel according to an embodiment of the present application, and FIG. 5 is a schematic layered structural diagram of a flexible display panel according to an embodiment of the present application.

Regarding to the step S31: a rigid substrate is provided. Referring to FIG. 3 and FIG. 4A together, FIG. 4A is a cross-sectional view of a rigid substrate according to an embodiment of the present application. The rigid substrate 400 has a panel area 41 and a panel edge area 43 divided by a laser cut line 42. The panel area 41 comprises a display area 411 and a non-display area 412, and the non-display area 412 is near the laser cut line 42.

In a further embodiment, the rigid substrate 400 may be a glass substrate, a silicon wafer, a metal or a rigid thin film. The rigid substrate needs to have a high laser transmittance to facilitate the subsequent laser stripping process.

Regarding to the step S32: a first polyimide layer is prepared on the rigid substrate. Referring to FIG. 3 and FIG. 4B together, FIG. 4B is a cross-sectional view of a first polyimide layer prepared on the rigid substrate according to an embodiment of the present application. A first polyimide layer 401*a* covers the panel area 41 and the panel edge area 43.

In a further embodiment, a material of the first polyimide layer 401*a* is a polyimide resin or a modified polyimide resin, and a thickness of the first polyimide layer 401*a* ranges from 5 to 15 µm, preferably 10 µm.

Regarding to the step S33: a water-oxygen barrier layer is deposited on the first polyimide layer. Referring to FIG. 3 and FIG. 4C together, FIG. 4C is a cross-sectional view of a water-oxygen barrier layer prepared on the first polyimide layer according to an embodiment of the present application. The water-oxygen barrier layer 402 covers the first polyimide layer 401*a*, and, that is, the water-oxygen barrier layer 202 corresponds to the panel area 21 and the panel edge area 23.

In a further embodiment, a material of the water-oxygen barrier layer 402 is silicon oxide ($SiO_x$) or silicon nitride ($SiN_x$), and a thickness of the water-oxygen barrier layer 402 ranges from 0.2 to 1 µm, preferably 0.5 µm. The water-oxygen barrier layer 402 is configured to block water and oxygen from permeating into the second polyimide layer 401*b* subsequently prepared, so as to prevent the damage to the panel display components prepared on the flexible base substrate (e.g., the circuit of the thin film transistor array layer and the light emitting material of the light emitting layer) caused by water, oxygen, and other intrusions, and improve the reliability of the flexible display panel adopting the flexible base substrate of the present application.

Regarding to the step S34: a protective layer is prepared on the water-oxygen barrier layer corresponding to the non-display area of the flexible display panel. Referring to FIG. 3 and FIG. 4D together, FIG. 4D is a cross-sectional view of a protective layer prepared on the water-oxygen barrier layer according to an embodiment of the present application. The protective layer 403 corresponds to the panel area 21 and near the laser cut line 42.

In a further embodiment, a material of the protective layer 403 comprises at least one of silicon oxide ($SiO_x$), silicon nitride ($SiN_x$), and amorphous silicon (α-Si), and a thickness of the protective layer 403 ranges from 0.1 to 5 µm, preferably 0.5 µm, 1 µm, or 2 µm. In the subsequent preparation of the flexible display panel, a laser or other means is used to cut along the laser cut line 42, the panel edge area 43 is cut off, and the final panel only retains the panel area 41. The retained panel area 41 after being cut is provided with the protective layer 403 near the laser cut line 42, which can extend the permeation path of water and oxygen to the second polyimide layer 401*b* from a side near the laser cut line 42. Thus, the flexible base substrate has excellent ability to block water and oxygen, and the reliability of the flexible display panel adopting the flexible base substrate of the present application is further improved.

Regarding to the step S35: a second polyimide layer is prepared on the protective layer and the water-oxygen barrier layer. Referring to FIG. 3 and FIG. 4E together, FIG. 4E is a cross-sectional view of a second polyimide layer prepared on the protective layer and the water-oxygen barrier layer according to an embodiment of the present application. The second polyimide layer 401*b* covers the protective layer 403 and the water-oxygen barrier layer 402, and, that is, the second polyimide layer 201 corresponds to the panel area 21 and the panel edge area 23.

In a further embodiment, a material of the second polyimide layer 401b is a polyimide resin or a modified polyimide resin, and a thickness of the second polyimide layer 401b ranges from 5 to 15 µm, preferably 10 µm. The thicknesses of the first polyimide layer 401a and the second polyimide layer 401b may be different, and the specific thicknesses can be selected according to the actual device type.

Regarding to the step S36: a thin film transistor array layer and an encapsulation layer are sequentially prepared on the second polyimide layer corresponding to the display area of the flexible display panel. Referring to FIG. 3 and FIG. 4F together, FIG. 4F is a cross-sectional view of a flexible display panel before being cut according to an embodiment of the present application. In the subsequent cutting, a cutting position of a cutting blade 49 (may be a laser cutting blade) corresponds to the laser cut line 42.

In the present embodiment, a light emitting layer 405 is prepared on the thin film transistor array layer 404. The encapsulation layer 406 is prepared on the light emitting layer 405. The encapsulation layer 406 covers a lateral side of the thin film transistor array layer 404 and a lateral side of the light emitting layer 405 near the non-display area 412, and partially covers the second polyimide layer 401b. In a further embodiment, the light emitting layer 405 is an OLED light emitting layer, and, that is, the prepared flexible display panel is an OLED flexible display panel.

In other embodiments, a quantum dot (QD)-OLED flexible display panel and other light emitting flexible display panels can be prepared according to the requirements. The encapsulation layer 406 is directly prepared on the thin film transistor array layer 404 according to the requirements. The encapsulation layer 406 covers an upper surface of the thin film transistor array layer 404, covers a lateral side of the thin film transistor array layer 404 near the non-display area 412, and partially covers the second polyimide layer 401b.

In a further embodiment, the thin film transistor array layer 404 comprises a gate insulating layer (GI) and a dielectric layer (OLD) stacked and disposed, and functional components arranged inside. The functional components comprise a polysilicon layer, a gate electrode (GE), and a source/drain electrode (S/D). The thin film transistor array layer 404 has a conventional structure, and the material and the thickness of each film layer adopted can be adjusted according to the requirements, and are not specifically limited in the present application. The encapsulation layer 406 has a conventional structure, and the material and the thickness adopted can be adjusted according to the requirements, and are not specifically limited in the present application.

In a further embodiment, the OLED light emitting layer comprises an anode, an OLED light emitting material layer, and a cathode stacked and disposed. The OLED light emitting layer has a conventional structure, and the material and the thickness of each film layer adopted can be adjusted according to the requirements, and are not specifically limited in the present application.

Regarding to the step S37: the rigid substrate is separated from the first polyimide layer, and the panel edge area is cut along the laser cut line to obtain the flexible display panel. Referring to FIG. 3 and FIG. 5 together, FIG. 5 is a schematic layered structural diagram of a flexible display panel according to an embodiment of the present application.

In a further embodiment, the rigid substrate 400 is separated from the first polyimide layer 401a using the laser stripping process, and the panel edge area 43 is cut along the laser cut line 42 using the laser to obtain the flexible display panel. The laser stripping process and the laser cutting process may be operated according to the conventional process in the art, and are not specifically limited in the present application.

The retained panel area 41 after being cut is provided with the protective layer 403 near the laser cut line 42, which can extend the permeation path (the permeation path as shown by an arrow 58 in FIG. 5) of water and oxygen to the second polyimide layer 401b from a side near the laser cut line 42. Thus, the flexible base substrate has excellent ability to block water and oxygen, and the reliability of the flexible display panel adopting the flexible base substrate of the present application is further improved.

Referring to FIG. 5 again, the present application further provides a flexible display panel. The flexible display panel comprises a panel area 41, and the panel area 41 comprises a display area 411 and a non-display area 412. The flexible display panel further comprises a flexible base substrate. The flexible base substrate comprises a first polyimide layer 401a formed in the display area 411 and the non-display area 412, a water-oxygen barrier layer 402 covering the first polyimide layer 401a, a protective layer 403 disposed on the water-oxygen barrier layer 402 and corresponding to the non-display area 412, and a second polyimide layer 401b covering the protective layer 403 and the water-oxygen barrier layer 402. Further, a thin film transistor array layer 404, a light emitting layer 405, and an encapsulation layer 406 sequentially stacked and disposed on the flexible base substrate and corresponding to the display area 411. The encapsulation layer 406 covers light emitting layer 405, covers a lateral side of the thin film transistor array layer 404 and a lateral side of the light emitting layer 405 near the non-display area 412, and partially covers the second polyimide layer 401b.

In a further embodiment, a material of the first polyimide layer 401a is a polyimide resin or a modified polyimide resin, and a thickness of the first polyimide layer 401a ranges from 5 to 15 µm, preferably 10 µm.

In a further embodiment, a material of the water-oxygen barrier layer 402 is silicon oxide ($SiO_x$) or silicon nitride ($SiN_x$), and a thickness of the water-oxygen barrier layer 402 ranges from 0.2 to 1 µm, preferably 0.5 µm. The water-oxygen barrier layer 402 is configured to block water and oxygen from permeating into the second polyimide layer 401b subsequently prepared, so as to prevent the damage to the panel display components prepared on the flexible base substrate (e.g., the circuit of the thin film transistor array layer and the light emitting material of the light emitting layer) caused by water, oxygen, and other intrusions, and improve the reliability of the flexible display panel adopting the flexible base substrate of the present application.

In a further embodiment, a material of the protective layer 403 comprises at least one of silicon oxide ($SiO_x$), silicon nitride ($SiN_x$), and amorphous silicon ($\alpha$-Si), and a thickness of the protective layer 403 ranges from 0.1 to 5 µm, preferably 0.5 µm, 1 µm, or 2 µm. The retained panel area 41 after being cut is provided with the protective layer 403 near the laser cut line 42, which can extend the permeation path (the permeation path as shown by an arrow in FIG. 5) of water and oxygen to the second polyimide layer 401b from a side near the laser cut line 42. Thus, the flexible base substrate has excellent ability to block water and oxygen, and the reliability of the flexible display panel adopting the flexible base substrate of the present application is further improved.

In a further embodiment, a material of the second polyimide layer 401b is a polyimide resin or a modified polyimide resin, and a thickness of the second polyimide layer 401b ranges from 5 to 15 μm, preferably 10 μm. The thicknesses of the first polyimide layer 401a and the second polyimide layer 401b may be different, and the specific thicknesses can be selected according to the actual device type.

In a further embodiment, the thin film transistor array layer 404 comprises a gate insulating layer (GI) and a dielectric layer (OLD) stacked and disposed, and functional components arranged inside. The functional components comprise a polysilicon layer, a gate electrode (GE), and a source/drain electrode (S/D). The thin film transistor array layer 404 has a conventional structure, and the material and the thickness of each film layer adopted can be adjusted according to the requirements, and are not specifically limited in the present application.

In a further embodiment, the light emitting layer 405 is an OLED light emitting layer, and, that is, the flexible display panel of the present application is an OLED flexible display panel. The OLED light emitting layer comprises an anode, an OLED light emitting material layer, and a cathode stacked and disposed. The OLED light emitting layer has a conventional structure, and the material and the thickness of each film layer adopted can be adjusted according to the requirements, and are not specifically limited in the present application.

In other embodiments, a liquid crystal display (LCD) and other light emitting flexible display panels can be prepared according to the requirements. The encapsulation layer 406 is directly prepared on the thin film transistor array layer 404 according to the requirements. The encapsulation layer 406 covers an upper surface of the thin film transistor array layer 404, covers a lateral side of the thin film transistor array layer 404 near the non-display area 412, and partially covers the second polyimide layer 401b. The encapsulation layer 406 has a conventional structure, and the material and the thickness adopted can be adjusted according to the requirements, and are not specifically limited in the present application.

In the flexible display panel of the present application, by preparing the composite substrate structure composed of the first polyimide layer, the water-oxygen barrier layer, the protective layer, and the second polyimide layer, the prepared flexible display panel has desired water and oxygen barrier property, thereby greatly reducing the probability of water and oxygen passing through the flexible base substrate, and improving the service lifespan of the flexible display panel. Also, the flexible base substrate has desired flexibility, which is conducive to a wide range of applications.

INDUSTRIAL APPLICABILITY

The subject matter of the present application can be manufactured and used in industry, and has industrial applicability.

What is claimed is:

1. A flexible base substrate having a panel area a panel edge area divided by a laser cut line, comprising:
    a first polyimide layer formed in the panel area and the panel edge area;
    a water-oxygen barrier layer covering the first polyimide layer;
    a protective layer disposed on the water-oxygen barrier layer in the panel area and near the laser cut line, wherein a material of the protective layer comprises at least one of silicon oxide, silicon nitride, and amorphous silicon, and a thickness of the protective layer ranges from 0.1 to 5 μm; and
    a second polyimide layer covering the protective layer and the water-oxygen barrier layer.

2. The flexible base substrate according to claim 1, wherein after the panel edge area is cut along the laser cut line, the water-oxygen barrier layer is configured to block water/oxygen permeation from a bottom of the second polyimide layer, and the protective layer is configured to block water/oxygen permeation from a lateral side of the second polyimide layer near the laser cut line.

3. The flexible base substrate according to claim 1, wherein a material of the water-oxygen barrier layer is silicon oxide or silicon nitride.

4. The flexible base substrate according to claim 1, wherein a thickness of the water-oxygen barrier layer ranges from 0.2 to 1 μm.

5. The flexible base substrate according to claim 1, wherein materials of the first polyimide layer and the second polyimide layer are polyimide resins or modified polyimide resins.

6. The flexible base substrate according to claim 1, wherein a thickness of the first polyimide layer ranges from 5 to 15 μm, and a thickness of the second polyimide layer ranges from 5 to 15 μm.

7. A flexible display panel comprising a panel area, the panel area comprising a display area and a non-display area, wherein the flexible display panel comprises:
    a flexible base substrate comprising a first polyimide layer formed in the display area and the non-display area, a water-oxygen barrier layer covering the first polyimide layer, a protective layer disposed on the water-oxygen barrier layer and corresponding to the non-display area, and a second polyimide layer covering the protective layer and the water-oxygen barrier layer; and
    a thin film transistor array layer and an encapsulation layer sequentially stacked and disposed on the flexible base substrate and corresponding to the display area, wherein the encapsulation layer covers a lateral side of the thin film transistor array layer near the non-display area, and partially covers the second polyimide layer.

8. The flexible display panel according to claim 7, wherein the water-oxygen barrier layer is configured to block water/oxygen permeation from a bottom of the second polyimide layer, and the protective layer is configured to block water/oxygen permeation from a lateral side of the second polyimide layer near the laser cut line.

9. The flexible display panel according to claim 7, wherein a material of the protective layer comprises at least one of silicon oxide, silicon nitride, and amorphous silicon.

10. The flexible display panel according to claim 7, wherein a thickness of the protective layer ranges from 0.1 to 5 μm.

11. The flexible display panel according to claim 7, wherein a material of the water-oxygen barrier layer is silicon oxide or silicon nitride.

12. The flexible display panel according to claim 7, wherein a thickness of the water-oxygen barrier layer ranges from 0.2 to 1 μm.

13. The flexible display panel according to claim 7, wherein materials of the first polyimide layer and the second polyimide layer are polyimide resins or modified polyimide resins.

14. The flexible display panel according to claim 7, wherein a thickness of the first polyimide layer ranges from 5 to 15 μm, and a thickness of the second polyimide layer ranges from 5 to 15 μm.

15. The flexible display panel according to claim 7, further comprising:
- a light emitting layer disposed on a side of the thin film transistor array layer away from the flexible base substrate and corresponding to the display area, wherein the encapsulation layer further covers a lateral side of the thin film transistor array layer and a lateral side of the light emitting layer near the non-display area, and partially covers the second polyimide layer.

16. A method for preparing a flexible display panel, comprising:
- providing a rigid substrate, wherein the rigid substrate has a panel area and a panel edge area divided by a laser cut line, wherein the panel area comprises a display area and a non-display area, and the non-display area is near the laser cut line;
- preparing a first polyimide layer on the rigid substrate, wherein the first polyimide layer is formed in the panel area and the panel edge area;
- depositing a water-oxygen barrier layer on the first polyimide layer, wherein the water-oxygen barrier layer covers the first polyimide layer;
- preparing a protective layer on the water-oxygen barrier layer corresponding to the non-display area, wherein the protective layer is near the laser cut line;
- preparing a second polyimide layer on the protective layer and the water-oxygen barrier layer;
- sequentially preparing a thin film transistor array layer and an encapsulation layer on the second polyimide layer corresponding to the display area, wherein the encapsulation layer covers a lateral side of the thin film transistor array layer near the non-display area, and partially covers the second polyimide layer; and
- separating the rigid substrate from the first polyimide layer, and cutting the panel edge area along the laser cut line to obtain the flexible display panel.

17. The method for preparing the flexible display panel according to claim 16, wherein the water-oxygen barrier layer is configured to block water/oxygen permeation from a bottom of the second polyimide layer, and the protective layer is configured to block water/oxygen permeation from a lateral side of the second polyimide layer near the laser cut line.

18. The method for preparing the flexible display panel according to claim 16, wherein a material of the protective layer comprises at least one of silicon oxide, silicon nitride, and amorphous silicon.

19. The method for preparing the flexible display panel according to claim 16, wherein a thickness of the protective layer ranges from 0.1 to 5 μm.

20. The method for preparing the flexible display panel according to claim 16, wherein the step of sequentially preparing the thin film transistor array layer and the encapsulation layer on the second polyimide layer corresponding to the display area, the encapsulation layer covering the lateral side of the thin film transistor array layer near the non-display area, and partially covering the second polyimide layer, further comprises:
- sequentially preparing a thin film transistor array layer, a light emitting layer, and an encapsulation layer on the second polyimide layer corresponding to the display area, wherein the encapsulation layer covers a lateral side of the thin film transistor array layer and a lateral side of the light emitting layer near the non-display area, and partially covers the second polyimide layer.

* * * * *